United States Patent
Hsieh

(10) Patent No.: US 8,564,047 B2
(45) Date of Patent: Oct. 22, 2013

(54) SEMICONDUCTOR POWER DEVICES INTEGRATED WITH A TRENCHED CLAMP DIODE

(75) Inventor: Fu-Yuan Hsieh, New Taipei (TW)

(73) Assignee: Force MOS Technology Co., Ltd., New Taipei (TW)

( * ) Notice: Subject to any disclaimer, the term of this patent is extended or adjusted under 35 U.S.C. 154(b) by 121 days.

(21) Appl. No.: 13/246,367

(22) Filed: Sep. 27, 2011

(65) Prior Publication Data
US 2013/0075810 A1    Mar. 28, 2013

(51) Int. Cl.
   *H01L 29/78*    (2006.01)
(52) U.S. Cl.
   USPC ........... 257/328; 257/330; 257/355; 257/356; 257/360; 257/577; 257/110; 257/120; 257/409; 257/340
(58) Field of Classification Search
   USPC ......... 257/173, 288, 302, 328, 341, 355, 356, 257/497, 498, 551, 577, 578, 603, 605, 360, 257/110, 120, 340, 409, 330
   See application file for complete search history.

(56) References Cited

U.S. PATENT DOCUMENTS

| 7,816,720 B1 * | 10/2010 | Hsieh ............................ 257/302 |
| 7,855,415 B2 * | 12/2010 | Challa et al. .................. 257/341 |
| 2006/0071276 A1 * | 4/2006 | Zundel et al. ................. 257/355 |

* cited by examiner

*Primary Examiner* — Eugene Lee
(74) *Attorney, Agent, or Firm* — Bacon & Thomas, PLLC

(57) ABSTRACT

A semiconductor power device having shielded gate structure integrated with a trenched clamp diode formed in a semiconductor silicon layer, wherein the shielded gate structure comprises a shielded electrode formed by a first poly-silicon layer and a gate electrode formed by a second poly-silicon layer. The trenched clamp diode is formed by the first poly-silicon layer. A shielded gate mask used to define the shielded gate is also used to define the trenched clamp diode. Therefore, one poly-silicon layer and a mask for the trenched clamp diode are saved.

14 Claims, 20 Drawing Sheets

SEMICONDUCTOR POWER DEVICES INTEGRATED WITH A TRENCHED CLAMP DIODE

FIELD OF THE INVENTION

This invention relates generally to the cell structure, device configuration and fabrication process of semiconductor power devices. More particularly, this invention relates to an improved cell configuration to manufacture semiconductor power devices having shielded gate structure and a trenched clamp diode with two poly-silicon layers process.

BACKGROUND OF THE INVENTION

Compared to a conventional semiconductor power device, for example a trench MOSFET, having trenched gates filled with a single electrode padded by a gate insulation layer, a trench MOSFET having shielded gate structure as shown in FIG. 1A (U.S. Pat. No. 7,855,415) is more attractive due to its reduced capacitance between gate and drain in accordance with its reduced charges between the gate and the drain, and increased breakdown voltage of the trench MOSFET, making an excellent choice for power switching applications such as inventors and DC to DC power supply circuits. Furthermore, in order to enhance ESD (electronic static discharge) capability or avalanche capability, a clamp diode is conventionally integrated with and onto the trench MOSFET having shielded gate structure of the prior art, for example as shown FIG. 1B, an ESD clamp diode is applied onto the trench MOSFET for improving ESD capability. However, conventional technologies for manufacturing such integrated circuits are continuously challenged to further reduce the manufacturing cost by reducing the number of masks and poly-silicon layers applied in the manufacturing process. For example, the integrated circuit shown in FIG. 1B requires three poly-silicon layers for shielded electrodes 101, gate electrodes 102 and an ESD clamp diode, respectively, and also requires two mask layers to define the trenched gates having shielded gate structure and the ESD clamp diode in the manufacturing process. Moreover, in FIG. 1B, the N+ source region has a same doping concentration at a same distance from a top surface of an n epitaxial layer 103 and the N+ source region has a same junction depth along the top surface of the n epitaxial layer 103, which may result in a bad avalanche capability (U.S. Pat. No. 7,816,720).

Therefore, there is still a need in the art of the semiconductor power device fabrication, particular in the semiconductor power devices having shielded gate structure integrated with a clamp diode, to provide a novel cell structure, device configuration and fabrication process that would further reduce the number of masks and poly-silicon layers applied in the manufacturing process without additional costs and manufacturing process steps.

SUMMARY OF THE INVENTION

It is therefore an aspect of the present invention to provide a semiconductor power device integrated with a trenched clamp diode in such a way that the mask and the poly-silicon layer specially used for the clamp diode in the prior art can be saved for cost reduction without additional costs and manufacturing process steps. Therefore, according to the present invention, there is provided a semiconductor power device comprising: a plurality of first type gate trenches extending into a semiconductor silicon layer and being spaced apart from each other, each of the first type gate trenches being filled with a shielded electrode in a lower portion and a gate electrode in an upper portion, the shielded electrode being insulated from the semiconductor silicon layer by a first gate insulation layer, the gate electrode being insulated from the semiconductor silicon layer by a second gate insulation layer, wherein the shielded electrode is formed by a first poly-silicon layer and is insulated from the gate electrode which formed by a second poly-silicon layer; said gate electrode is insulated from said shielded electrode by a inter-electrode insulation layer; and a trenched clamp diode comprising multiple back to back poly-silicon Zener diodes with alternating doped regions of a first conductivity type next to doped regions of a second conductivity type, which is complementary to the first conductivity type, formed in a first wide gate trench extending into the semiconductor silicon layer, the trenched clamp diode being formed by the same first poly-silicon layer as the shielded electrode and being insulated from the semiconductor silicon layer by a diode insulation layer. The semiconductor power device can be trench MOSFET (Metal Oxide Semiconductor Field Effect Transistor) or IGBT (Insulated Gate Bipolar Transistor) depending on the semiconductor silicon layer prepared. In the case of a trench MOSFET, the semiconductor silicon layer comprises an epitaxial layer of the first conductivity type onto a substrate of the first conductivity type. In the case of a trench IGBT, the semiconductor silicon layer comprises an epitaxial layer of the first conductivity type onto a buffer layer of the first conductivity type, which has a higher doping concentration than the epitaxial layer, extending over a substrate of the second conductivity type.

It is therefore another aspect of the present invention to provide a semiconductor power device further comprising: body regions of the second conductivity type in an upper portion of the semiconductor layer; source regions of the first conductivity type in the body regions, the source regions surrounding the first type gate trenches and encompassed in the body regions; and a trenched source-body contact filled with a contact metal plug and connected to a source metal layer of the semiconductor power device, the trenched source-body contact penetrating through a contact interlayer, the source regions and extending into the body regions between a pair of the first type gate trenches. In some preferred embodiments, as no source masks is used in the fabrication process, the source regions are formed in such a way that: having a doping concentration along trench sidewalls of the trenched source-body contact higher than along an adjacent channel region near the first type gate trenches at a same distance from a top surface of the semiconductor silicon layer; having a junction depth along the trench sidewalls of the trenched source-body contact greater than along the adjacent channel region; and having a doping profile of a Gaussian-distribution along the top surface of the semiconductor silicon layer from the trench sidewalls of the trenched source-body contact to the adjacent channel region. In some other preferred embodiment, the source regions also can be formed to have a doping concentration at a same distance from a top surface of the semiconductor silicon layer, and to have a same junction depth from the top surface of the semiconductor silicon layer.

It is therefore another aspect of the present invention to provide a semiconductor power device further comprising: a trenched resistor formed in the semiconductor silicon layer and comprising a doped poly-silicon layer which is formed by the first poly-silicon layer, wherein the trenched resistor is filled in a second wide gate trench and is insulated from the semiconductor silicon layer by a resistor insulation layer; the trenched resistor is simultaneously connected to two gate metal layers, which are separately located, of the semiconductor power device via trenched metal contacts. Around a bottom of each the trenched metal contact, there is further provided a first implanted region of the second conductivity type in the trenched resistor. In some preferred embodiments, the doped poly-silicon layer in the trenched resistor has the first conductivity type. In some other preferred embodiments, the doped poly-silicon layer in the trenched resistor has the second conductivity type, and has a lower doping concentration than the first implanted region, and furthermore, a second implanted region of the first conductivity type is further provided located above the first implanted region and flanking each the trenched metal contact.

It is therefore another aspect of the present invention that the contact metal plug is tungsten plug padded by a barrier layer of Ti/TiN or Co/TiN or Ta/TiN and has a top surface no higher than the contact interlayer. In some other preferred embodiment, the contact metal plug is tungsten plug padded by a barrier layer of Ti/TiN or Co/TiN or Ta/TiN and is extending over the contact interlayer.

Some preferred embodiments include one or more detail features as followed: the semiconductor power device further comprises a second type gate trench extending into the semiconductor silicon layer and filled with a single shielded electrode which is formed by the first poly-silicon layer and insulated from the semiconductor silicon layer by the first gate insulation layer, wherein the single shielded electrode is connected to a source metal layer of the semiconductor power device via a trenched shielded electrode contact; the semiconductor power device further comprises a third type gate trench extending into the semiconductor silicon layer and filled with a shielded electrode and a gate electrode above which have the same structure as that filled in the first type gate trenches, wherein the gate electrode in the third type gate trench is connected to a gate metal layer of the semiconductor power device via a trenched gate contact; the semiconductor power device further comprises a termination area comprising trenched floating rings further comprising multiple fourth type gate trenches which are formed in the semiconductor silicon layer and spaced from each other, wherein each of the fourth type gate trenches is filled with a single electrode which is formed by the first poly-silicon layer and insulated from the semiconductor silicon layer by the first gate insulation layer; the semiconductor power device further comprises a termination area comprising trenched floating rings further comprising multiple fourth type gate trenches which are formed in the semiconductor silicon layer and spaced from each other, wherein each of the fourth type gate trenches is filled with a shielded electrode and a gate electrode above, which have the same structure as that filled in the first type gate trenches; the semiconductor power device further comprises a body contact doped region of the second conductivity type formed in the body regions and having a higher doping concentration than the body regions, wherein the body contact doped regions is underneath the source regions and surrounding a bottom of the trenched source-body contact to reduce the contact resistance between the body regions and the contact metal plug in the trenched source-body contact.

This invention further discloses a method of manufacturing a semiconductor power device comprising the steps of: forming a plurality of first type gate trenches and a first wide gate trench in a semiconductor silicon layer; depositing a first poly-silicon layer which is to be formed as a shielded electrode for each the first type gate trench and to be formed as a trenched clamp diode in the first wide gate trench; depositing a second poly-silicon layer which is to be formed as a gate electrode for each the first type gate trench and insulated from the shielded electrode underneath. The method further comprises forming source regions of a first conductivity type in body regions of a second conductivity type without requiring a source mask by carrying out a source dopant ion implantation through a contact hole which is formed penetrating through a contact interlayer to expose a top surface of the semiconductor silicon layer. The method further comprises forming a trenched resistor by depositing the first poly-silicon layer also in a second wide gate trench which is formed in the semiconductor silicon layer.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part hereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
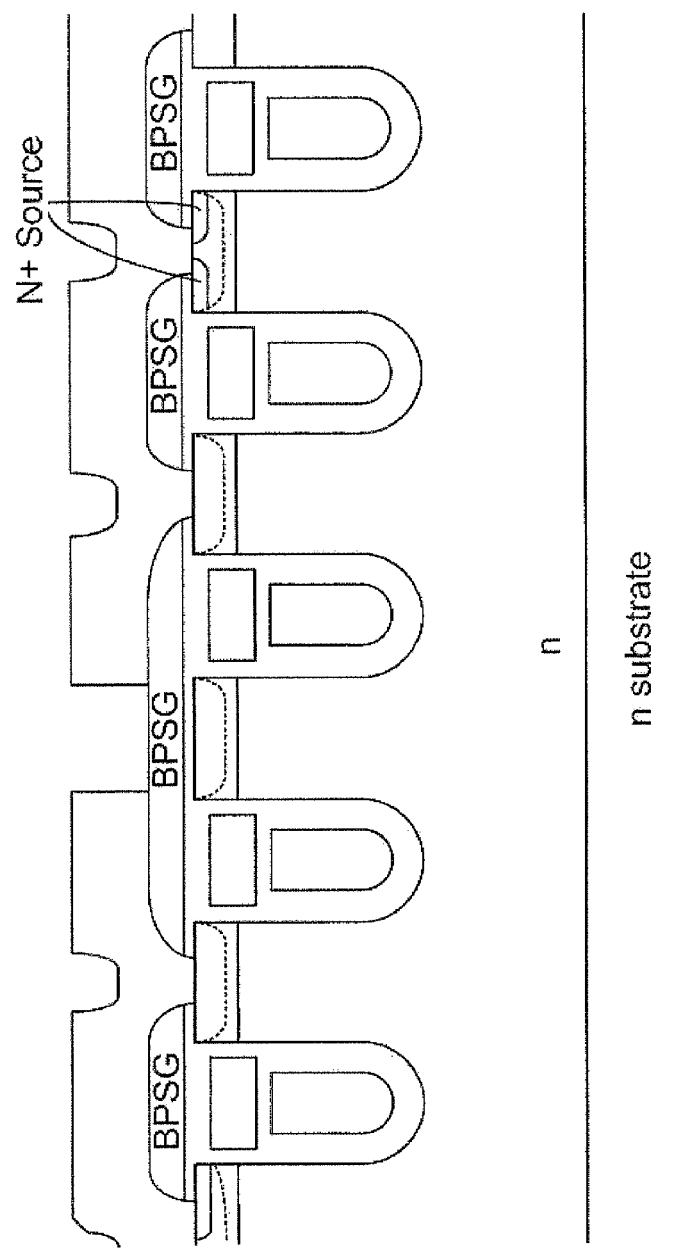
FIG. 1A is a cross-sectional view of a trench MOSFET having a shielded gate structure of a prior art.
Figure 1B:
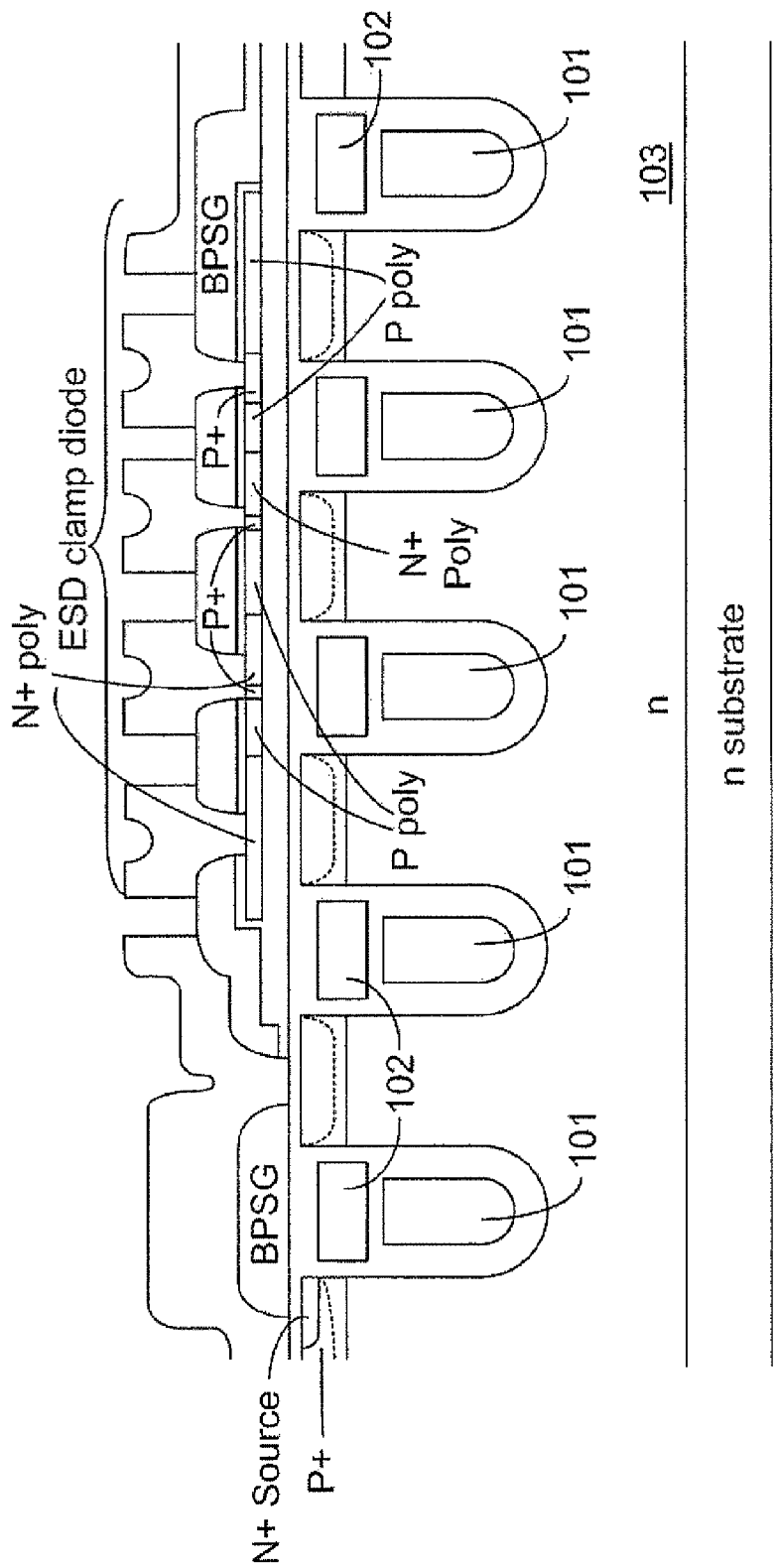
FIG. 1B is a cross-sectional view of the trench MOSFET of FIG. 1A integrated with an ESD clamp diode according to the prior art.
Figure 2A:
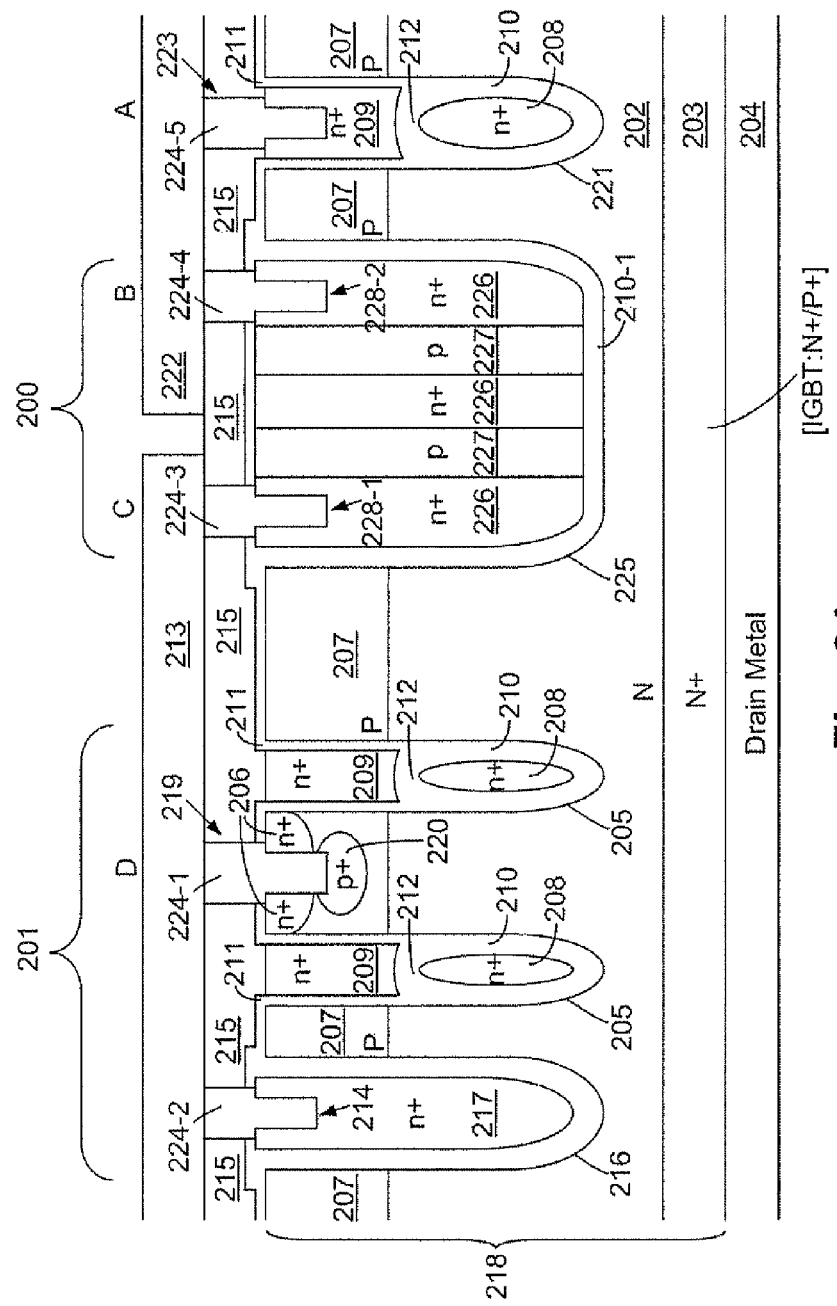
FIG. 2A is a cross-section view of a preferred embodiment for a semiconductor power device according to the present invention.
Figure 2B:
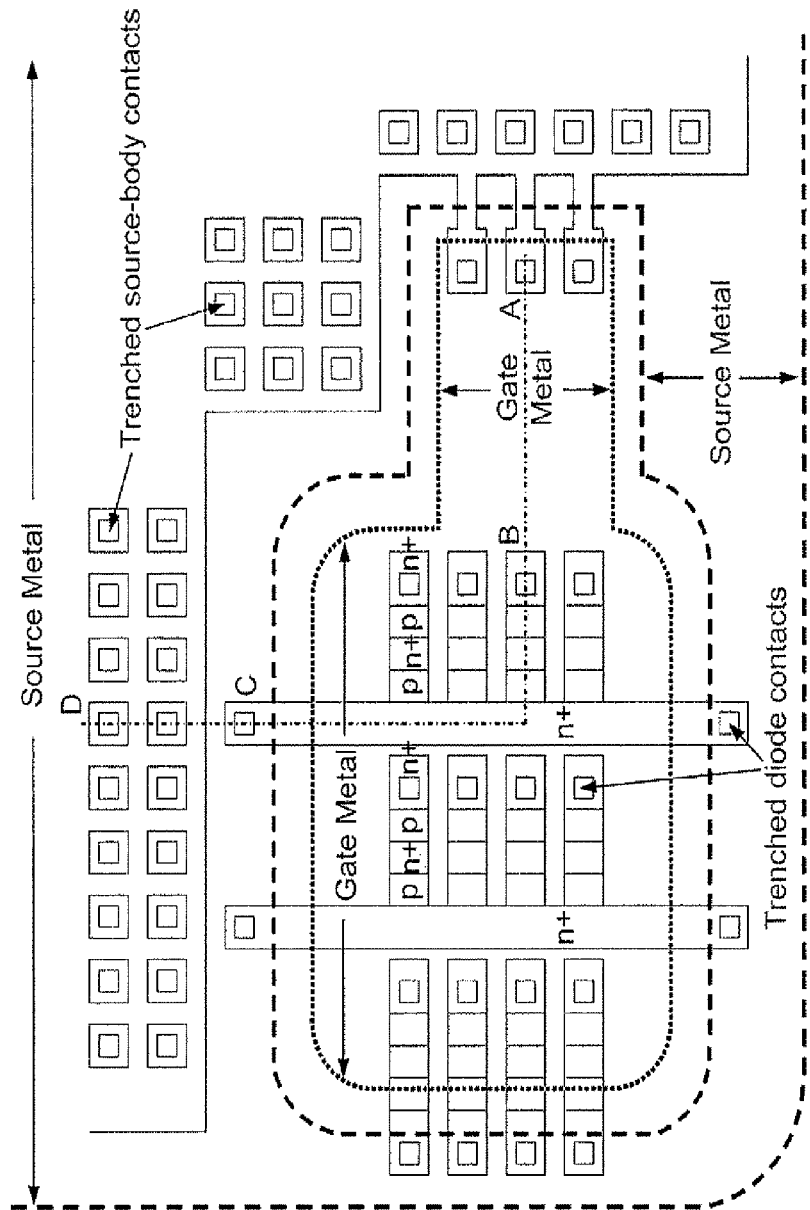
FIG. 2B is a top view of a preferred embodiment comprising close cells for a semiconductor power device according to the present invention.
Figure 2C:
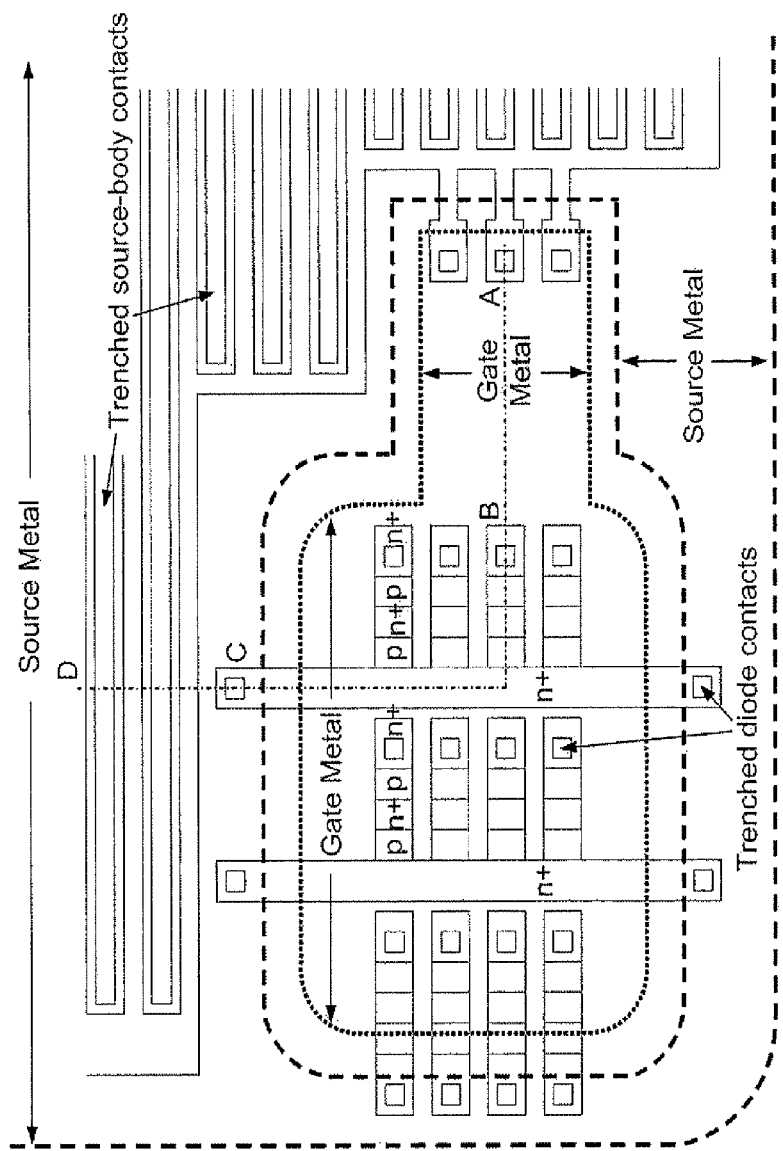
FIG. 2C is a top view of a preferred embodiment comprising stripe cells for a semiconductor power device according to the present invention.

Please refer to FIG. 2A for an A-B-C-D cross sectional view of FIG. 2B and FIG. 2C, wherein a preferred embodiment of an N-channel trench semiconductor power device is shown comprising an N-channel trench MOSFET 201 integrated with a trenched clamp diode 200 between gate and source for ESD prevention. The N-channel trench MOSFET 201 is formed in a semiconductor silicon layer which can be implemented by comprising an N epitaxial layer 202 above a heavily doped N+ substrate 203 coated with a back metal of Ti/Ni/Ag on a rear side as a drain metal layer 204. In the case of an N-channel trench IGBT, the heavily doped N+ substrate 203 can be replaced by an N+ buffer layer extending over a P+ substrate. In the N− trench MOSFET 201, a plurality of first type gate trenches 205, a second type gate trench 216, a third type gate trench 221 and a first wide gate trench 225 are formed extending from a top surface of the semiconductor silicon layer 218 and being spaced from each other, wherein the first wide gate trench 225 has a greater trench width than the other gate trenches. P body regions 207 are extending between those gate trenches and encompassing n+ source regions 206 which are flanking the first type gate trenches 205. The P body regions 207 and the n+ source regions 206 are connected to a source metal layer 213 onto a contact interlayer 215 via a trenched source-body contact 219 filled with a contact metal plug 224-1, wherein the n+ source regions 206 have a doping concentration along trench sidewalls of the trenched source-body contact 219 higher than along an adjacent channel region near the first type gate trenches 205 at a same distance from the top surface of the semiconductor silicon layer 218 and the n+ source regions 206 have a junction depth along the trench sidewalls of the trenched source-body contact 219 greater than along the adjacent channel region near the first type gate trenches 205, and the n+ source regions 206 have a doping profile of a Gaussian-distribution along the top surface of the semiconductor silicon layer 218 from the trench sidewalls of the trenched source-body contact 219 to the adjacent channel region. The doping concentration and junction depth profile of the n+ source regions 206 would result in a better avalanche capability (U.S. Pat. No. 7,816,720). A p+ body contact doped region 220 having a higher doping concentration than the P body regions 207 is formed under the n+ source regions 206 and surrounding a bottom of the trenched source-body contact 219 to reduce the contact resistance between the P body regions 207 and the contact metal plug 224-1. In each of the first type gate trenches 205 and the third type gate trench 221, a shielded gate structure is formed comprising: a shielded electrode 208 in a lower portion and insulated from the semiconductor silicon layer 218 by a first gate insulation layer 210; a gate electrode 209 in an upper portion and insulated from the semiconductor silicon layer 218 by a second gate insulation layer 211 which has a smaller thickness than the first gate insulation layer 210; an inter-electrode insulation layer 212 insulated the gate electrode 209 from the shielded electrode 208 underneath. The P body regions 207 are disposed at a level above a bottom of the gate electrode 209. Meanwhile, the shielded electrode is formed by a first poly-silicon layer and the gate electrode is formed by a second poly-silicon layer. The shielded electrode 208 is finally connected to the source metal layer 213 by connecting a single shielded electrode 217, which is filled in the second type gate trench 216, to the source metal layer 213 via a trenched shielded electrode contact 214 filled with a contact metal plug 224-2 which is the same as the contact metal layer 224-1. The trenched clamp diode 200 formed in the wide first gate trench 225 is formed by the first poly-silicon layer, according to the present invention, and comprises multiple back to back poly-silicon Zener diodes with alternating n+ doped regions 226 next to p doped regions 227, wherein the trenched clamp diode 200 is insulated from the semiconductor silicon layer 208 by a diode insulation layer 210-1, which has the same thickness as the first gate insulation layer 210. The trenched clamp diode 200 is simultaneously connected to the source metal layer 213 and a gate metal layer 222 via trenched diode contacts 228-1 and 228-2 respectively filled with contact metal plugs 224-3 and 224-4, which are the same as the contact metal plug 224-1, in the two opposite sides of the trenched clamp diode. The gate metal layer 222 is further connected to the gate electrode 209 in the second type gate trench 221 via a trenched gate contact 223 filled with a contact metal plug 224-5 which is the same as the contact metal plug 224-1. The contact metal plugs 224-1-224-5, for example, can be made by a tungsten plug padded by a barrier metal layer of Ti/TiN or Co/TiN or Ta/TiN, which has a top surface no higher than the contact interlayer 215. Compared to the ESD clamp diode of the prior art as shown in FIG. 1B, the trenched lamp diode 200 according to the preferred embodiment would result in that less of the second poly-silicon layer recess in gate trenches by doing dry poly-silicon etch or poly-silicon CMP (chemical mechanical polishing) without having the second poly-silicon layer residue along edges of the trenched clamp diode 200, which leads to a simpler topology.

FIG. 2B is a top view of the preferred semiconductor power device comprising close cells, and FIG. 2C is a top view of the preferred semiconductor power device comprising stripe cells according to the present invention.

Figure 2D:
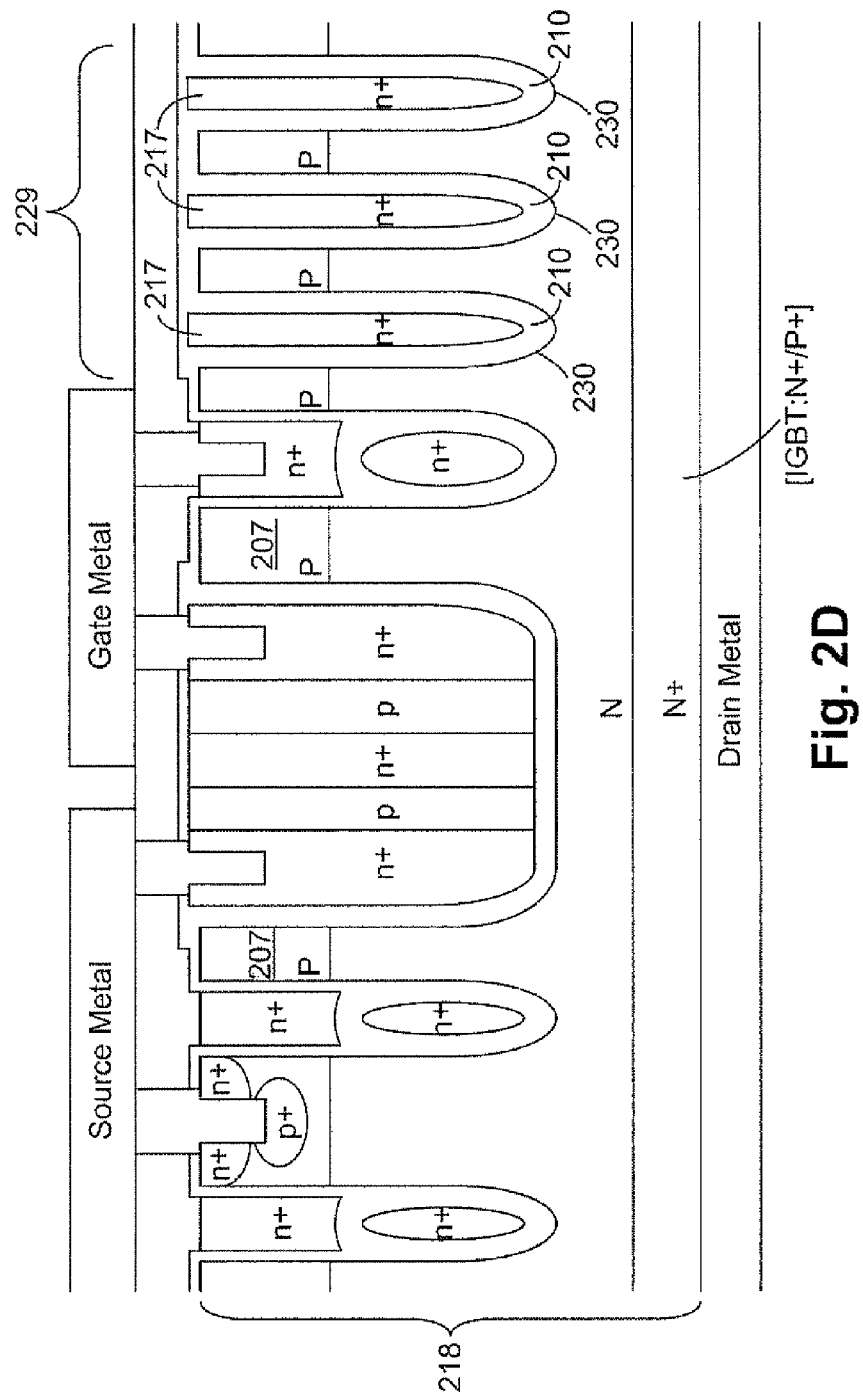
FIG. 2D is a cross-section view showing a termination area of a preferred embodiment for a semiconductor power device according to the present invention.

FIG. 2D shows the semiconductor power device of FIG. 2A with a termination area 229, The termination area 229 comprises trenched floating gates which further comprise multiple fourth type gate trenches 230 extending into the semiconductor silicon layer 218 and being spaced apart by the p body regions 207, wherein each of the fourth type gate trenches 230 is filled with a single electrode 217, which is formed by the first poly-silicon layer, padded by the first gate insulation layer 210.

Figure 2E:
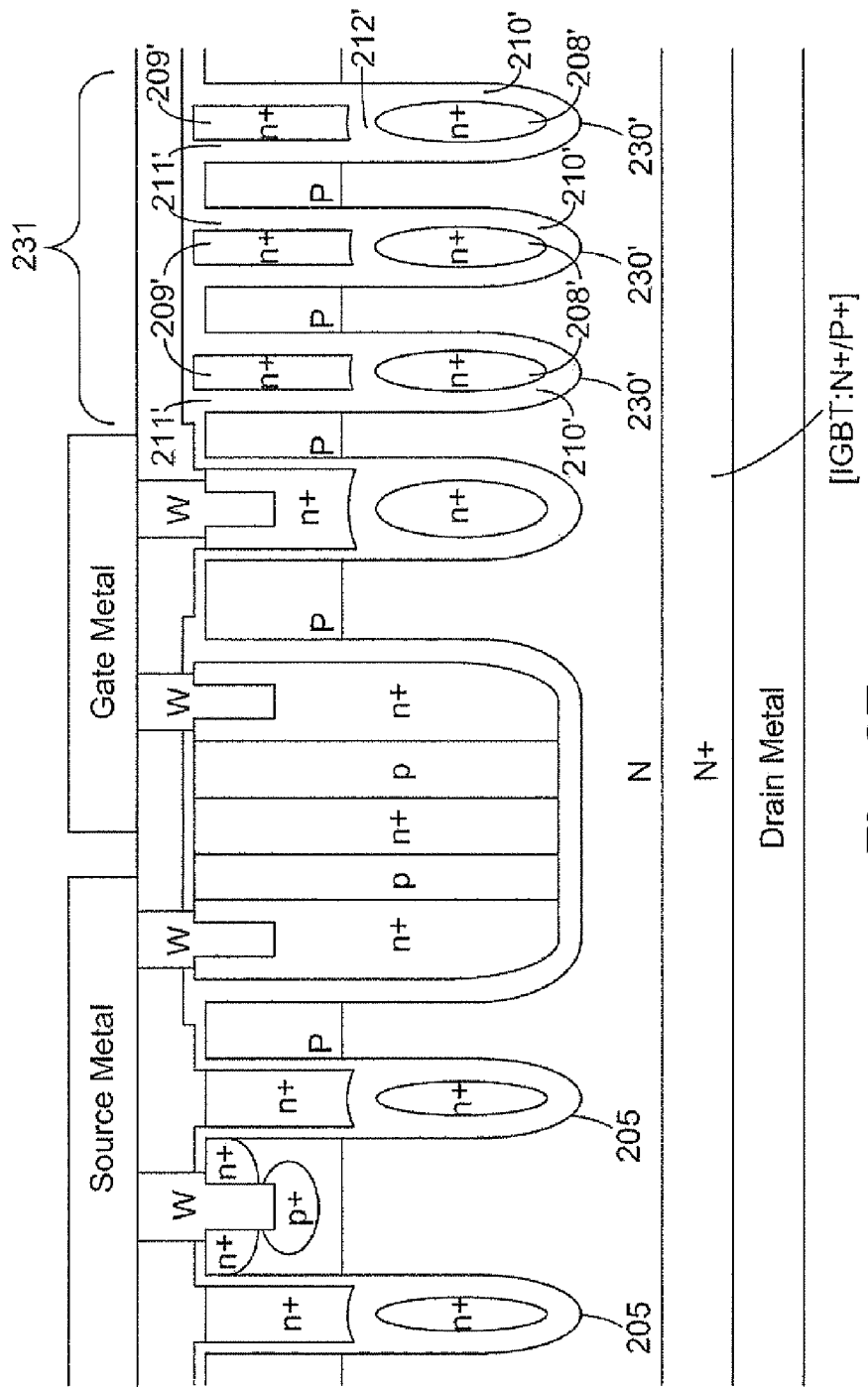
FIG. 2E is a cross-section view showing another termination area of a preferred embodiment for a semiconductor power device according to the present invention.

FIG. 2E shows the semiconductor power device of FIG. 2A with a termination area 231. The termination area 231 in FIG. 2E is similar to the termination area 229 in FIG. 2D except that each of the fourth type gate trenches 230' has the same shielded gate structure as the first type gate trenches 205 and is filled with a shielded electrode 208' in a lower portion and a gate electrode 209' in an upper portion, wherein the sidewalk and the bottom of the shielded electrode 208' are surrounded by a first gate insulation layer 210', the sidewalls of the gate electrode 209' are surrounded by a second gate insulation layer 211', and the first gate insulation layer 210' has a greater thickness than the second gate insulation layer 211'. The shielded electrode 208' and the gate electrode 209' are insulated from each other by an inter-electrode insulation layer 212', wherein the shielded electrode 208' is formed by the first poly-silicon layer and the gate electrode 209' is formed by the second poly-silicon layer.

Figure 3:
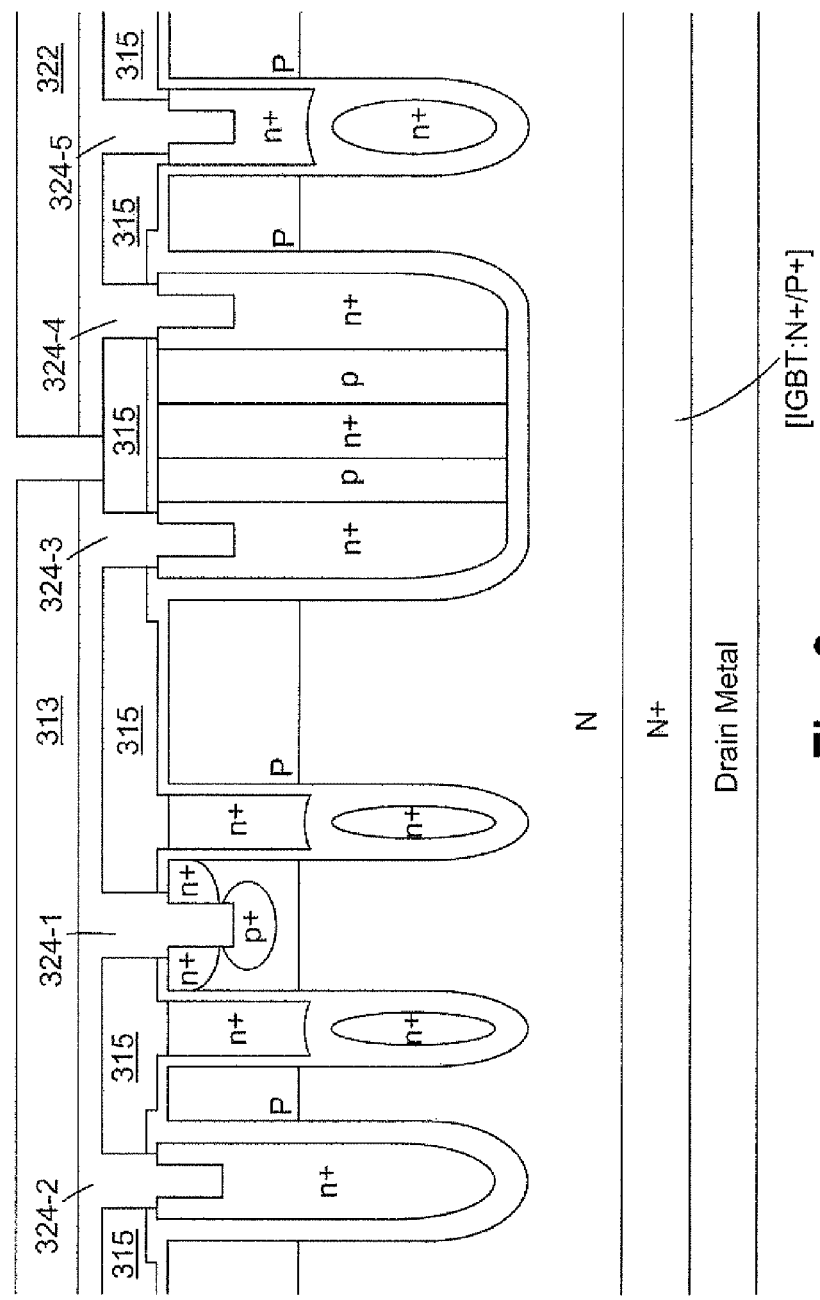
FIG. 3 is a cross-section view of another preferred embodiment for a semiconductor power device according to the present invention.

Please refer to FIG. 3 for another preferred embodiment of this invention. The semiconductor power device of FIG. 3 is similar to that of FIG. 2A except that, in FIG. 3, the contact metal plugs 324-1~324-5 are further extended covering a top surface of the contact interlayer 315 to be better contacted with the source metal layer 313 and the gate metal layer 312, respectively.

Figure 4:
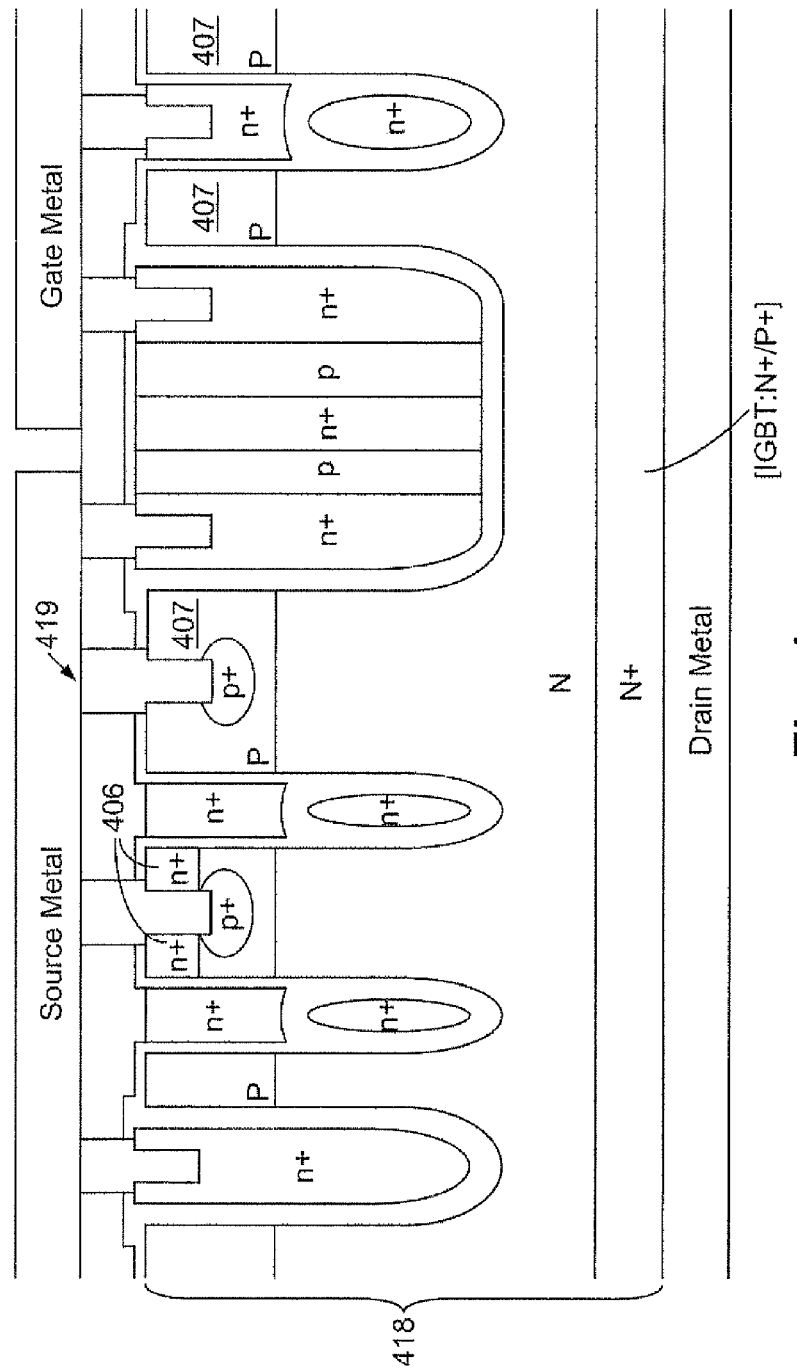
FIG. 4 is a cross-section view of another preferred embodiment for a semiconductor power device according to the present invention.

Please refer to FIG. 4 for another preferred embodiment of this invention. The semiconductor power device of FIG. 4 is similar to that of FIG. 2A except that, in FIG. 4, the n+ source regions 406 have a same doping concentration at a same distance from a top surface of the semiconductor silicon layer 418, and the n+ source regions 406 have a same junction depth from the top surface of the semiconductor silicon layer 418. Furthermore, in FIG. 4 there is another trenched source-body contact 419 directly extending into the P body region 407 without penetrating the n+ source regions 406.

Figure 5:
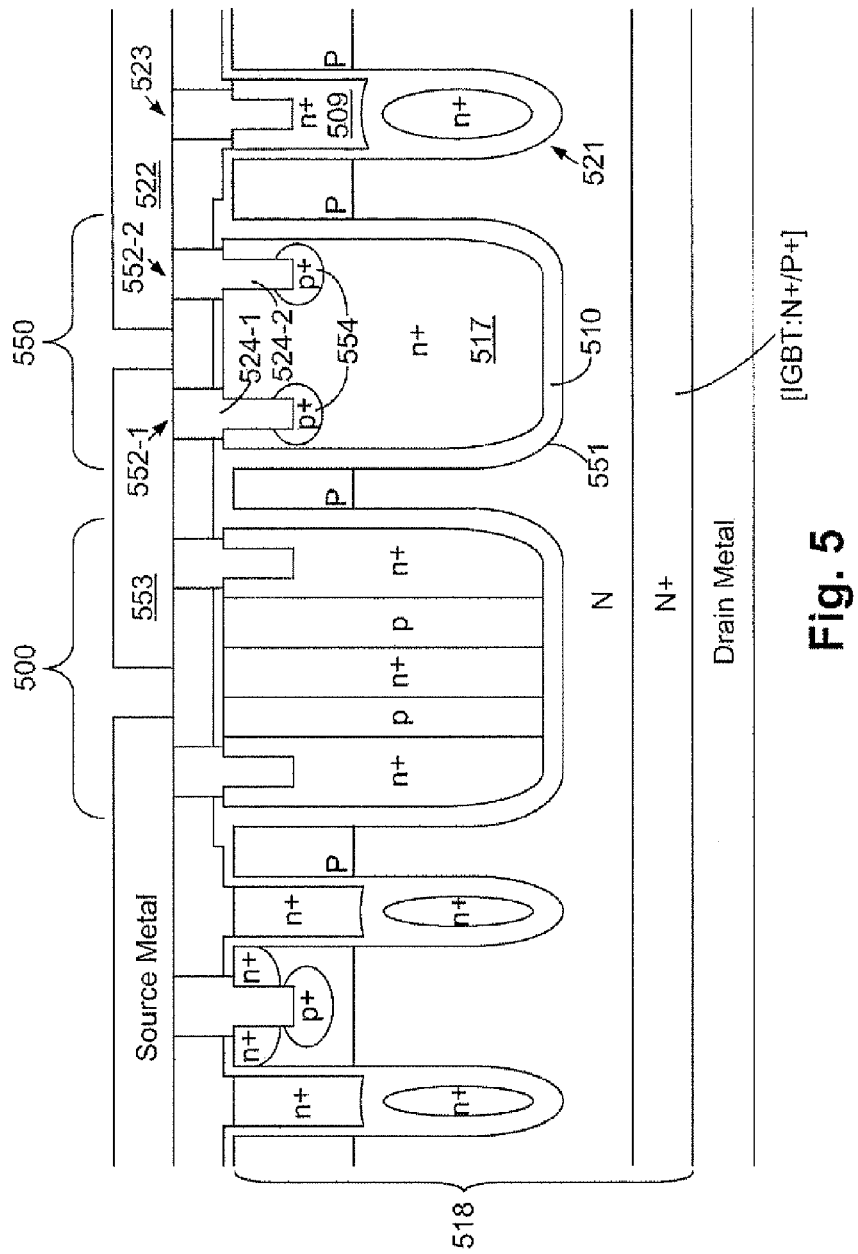
FIG. 5 is a cross-section view of another preferred embodiment for a semiconductor power device according to the present invention.

FIG. 5 shows the semiconductor power device of FIG. 2A integrated with a trenched resistor 550 in the semiconductor silicon layer 518 to be simultaneously connected to a first gate metal layer 553 and a second gate metal layer 522 which are separately located. The trenched resistor 550 formed in a second wide gate trench 551 comprises an n+ doped poly-silicon layer 517, which is formed by the first poly-silicon layer, padded by a resistor insulation layer 510. The trenched resistor 550 is connected to the first gate metal layer 553 and the second gate metal layer 522 by trenched metal contacts 552-1 and 552-2 respectively filled with contact metal plugs 524-1 and 524-2 which are extending into the n+ doped poly-silicon layer 517, wherein the first gate metal layer 553 is further connected to one side of the trenched clamp diode 500. A first implanted region 554 of p+ conductivity type is formed around a bottom of each the trenched metal contacts (552-1 and 552-1) to reduce the contact resistance between the n+ doped poly-silicon 517 and the contact metal plugs (524-1 and 524-2).

Figure 6:
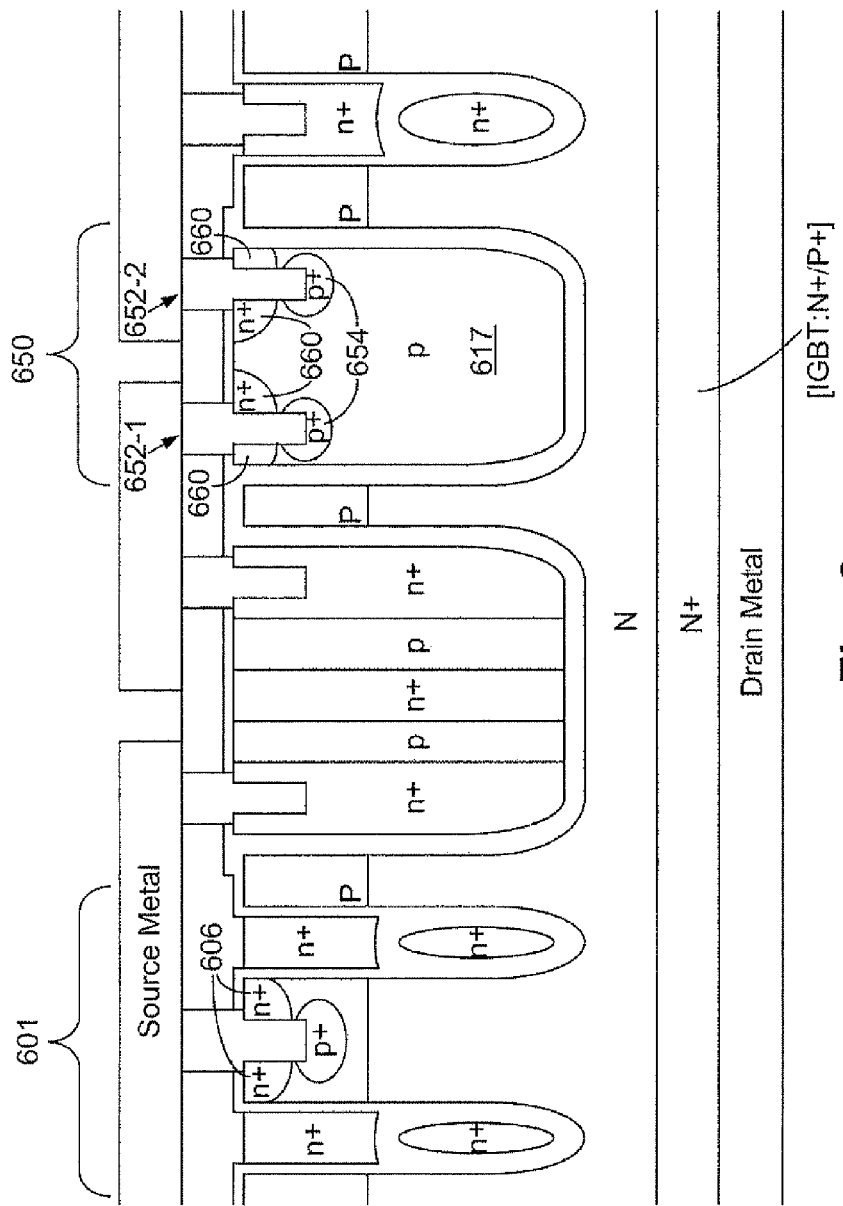
FIG. 6 is a cross-section view of another preferred embodiment for a semiconductor power device according to the present invention.

FIG. 6 shows the semiconductor power device of the FIG. 2A integrated with a trenched resistor 650. The trenched resistor 650 in FIG. 6 is similar to the trenched resistor 550 in FIG. 5 except that the doped poly-silicon layer 617 is of p conductivity type and there is further provided a second implanted region 660 of n+ conductivity type above the first implanted region 654 and flanking each of the trenched metal contacts (652-1 and 652-2). The second implanted region 660 is formed by a same method as the n+ source regions therefore has a similar distribution profile to the n+ source regions 606 in the trench MOSFET 601.

As an alternative to the exemplary embodiment illustrated and described above, the semiconductor power device can also be formed as a trench IGBT. In the case of a trench IGBT, the heavily doped N+ substrate should be replaced by an N+ buffer layer extending over a heavily doped P+ substrate. In this regards, the terminology, such as "source", "body", "drain" should be accordingly replaced by "emitter", "base", "collector"

Figure 7A:
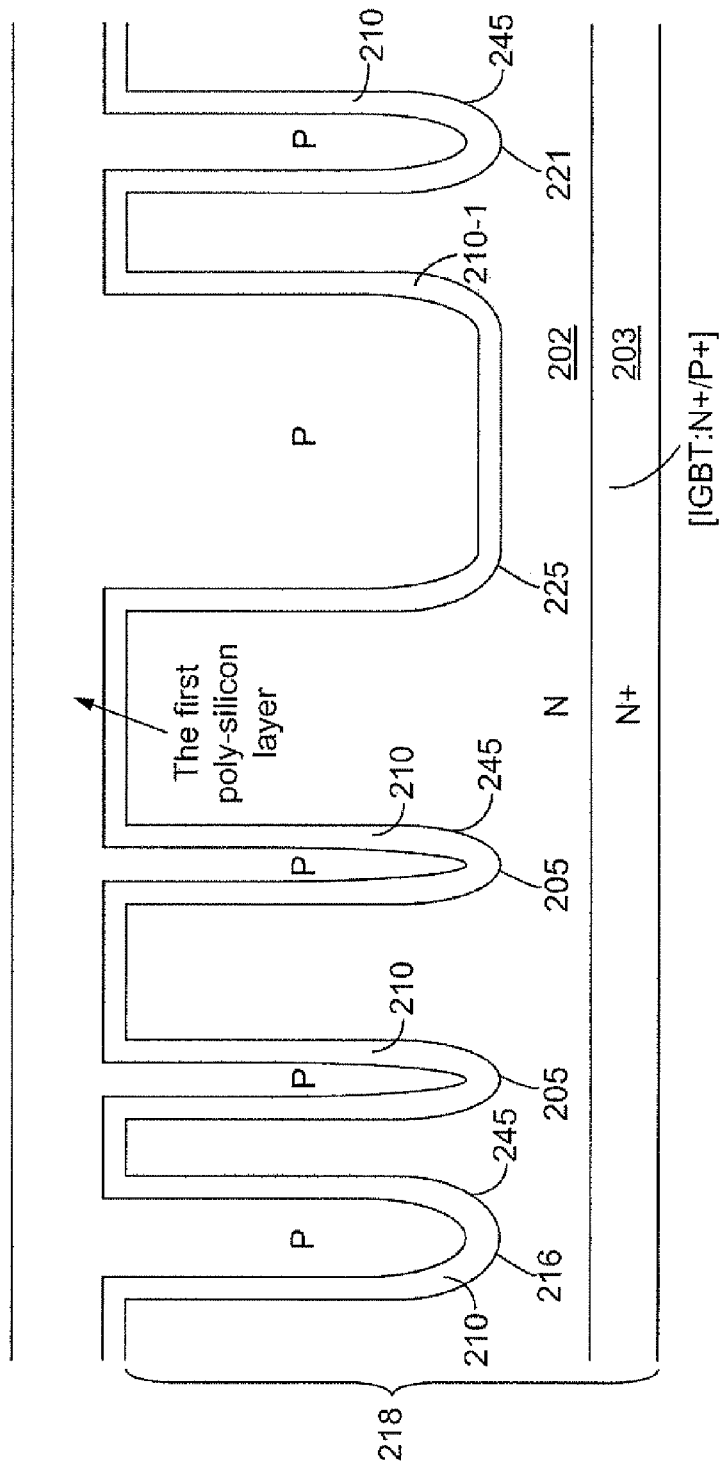
FIGS. 7A to 7I are a serial of side cross-sectional views for showing the process steps for manufacturing a semiconductor power device as shown in FIG. 2A.

FIGS. 7A to 7I show a process of manufacturing the semiconductor power device as shown in FIG. 2A. Referring to FIG. 7A, a semiconductor silicon layer 218 is formed by growing an N epitaxial layer 202 on a heavily doped N+ substrate 203. In the case of an N-channel trench IGBT, the semiconductor silicon layer can be formed by growing an N epitaxial layer on an N+ buffer layer onto a heavily doped P+ substrate. Next, a trench mask (not shown) is applied and followed by a trench etching process to form a plurality of gate trenches to a certain depth in the N epitaxial layer 202, including: a plurality of first type gate trenches 205, a second type gate trench 216, a third type gate trench 221 and a first wide gate trench 225. Then, a sacrificial oxide layer (not shown) is grown and then removed to eliminate the plasma damaged silicon layer formed during the process of opening the gate trenches. Then, an oxide layer is deposited along an inner surface and a top surface of the semiconductor silicon layer 218 to function as a diode insulation layer 210-1 and a first gate insulation layer 210 respectively for the first wide gate trench 225 and for the other gate trenches. Then, a first poly-silicon layer comprising an un-doped poly-silicon layer is deposited onto the first gate insulation layer 210 and the diode insulation layer 210-1 to fill all the gate trenches and cover the top surface of the semiconductor silicon layer 218. Next, a blank Boron ion implantation process and a drive-in process are successively carried out to make the first poly-silicon layer a P doped poly-silicon layer. A poly-silicon CMP process or a dry poly-silicon process is then followed to remove the P doped poly-silicon layer from top surface of the semiconductor silicon layer.

Figure 7B:
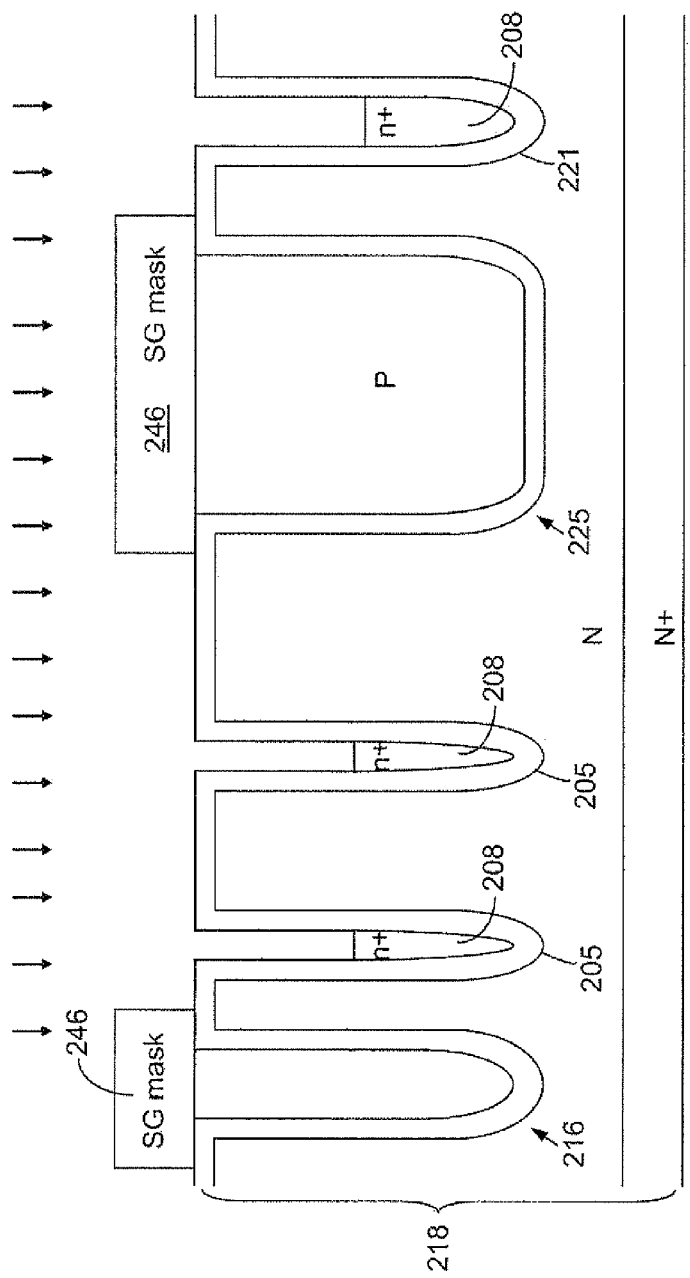
Figure 7C:
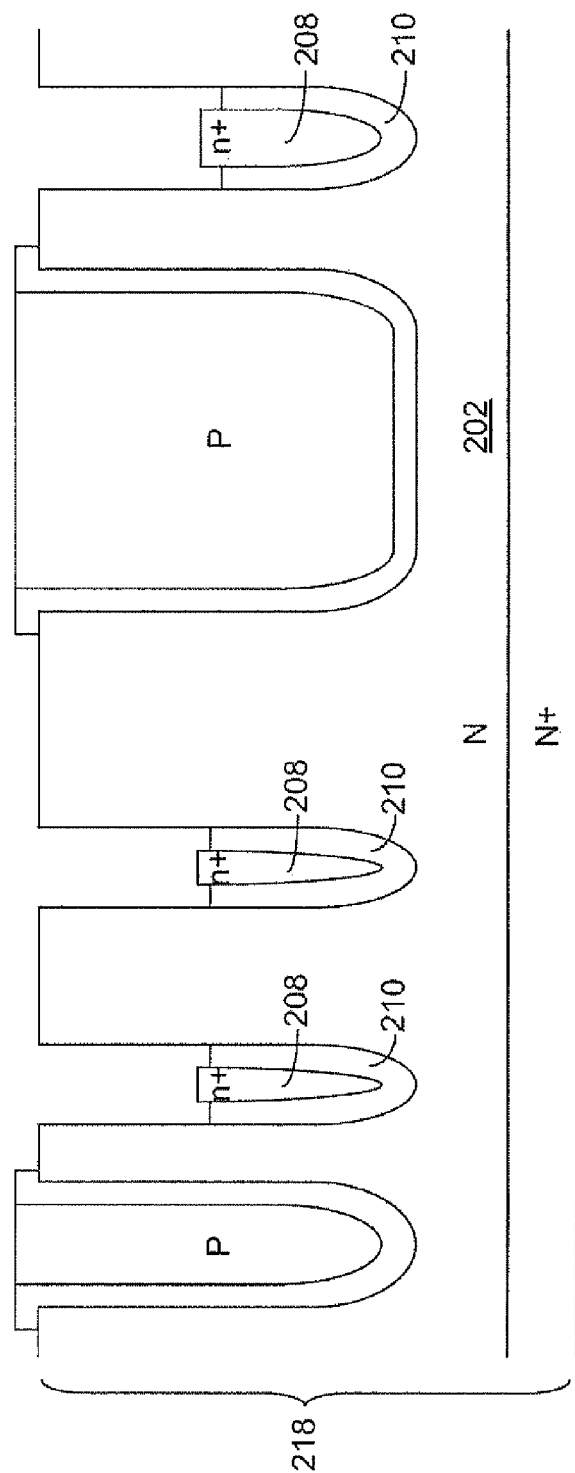
Figure 7D:
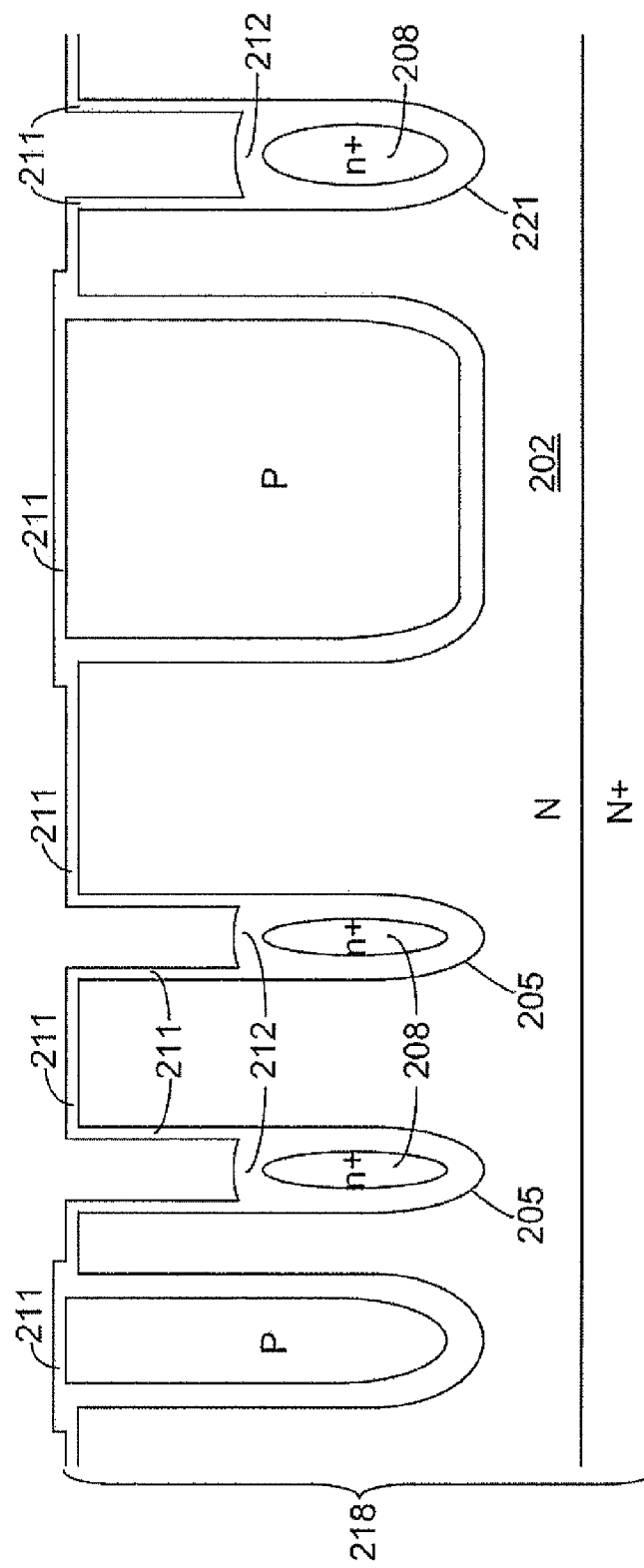

In FIG. 7B, after a shielded gate mask (SG mask, as illustrated) 246 is applied onto the first poly-silicon layer, a dry poly-silicon etching process or a poly-silicon CMP process is carried out to remove the first poly-silicon layer from an upper portion of the first type gate trenches 205, the third type gate trench 221, and from the top surface of the semiconductor power silicon layer 218. Then, before removing the SG mask 246, an Arsenic or Phosphorus ion implantation process is performed to form a shielded electrode 208 of n+ type in each the first type gate trenches 205 and the third type gate trench 221. In FIG. 7C, the first gate insulation layer 210 is etched away by a wet oxide etching process from above the shielded electrode 208 and from the top surface of the semiconductor silicon layer 218. In FIG. 7D, a gate oxidation process is carried out to form an inter-electrode insulation layer 212 onto a top surface of the shielded electrode 208, while to form a second gate insulation layer 211 along the inner surface above the shielded electrode 208 of each the first type gate trench 205 and the third type gate trench 221, as well as covering the top surface of the semiconductor silicon layer 208 and an outer surface of the first poly-silicon layer.

Figure 7E:
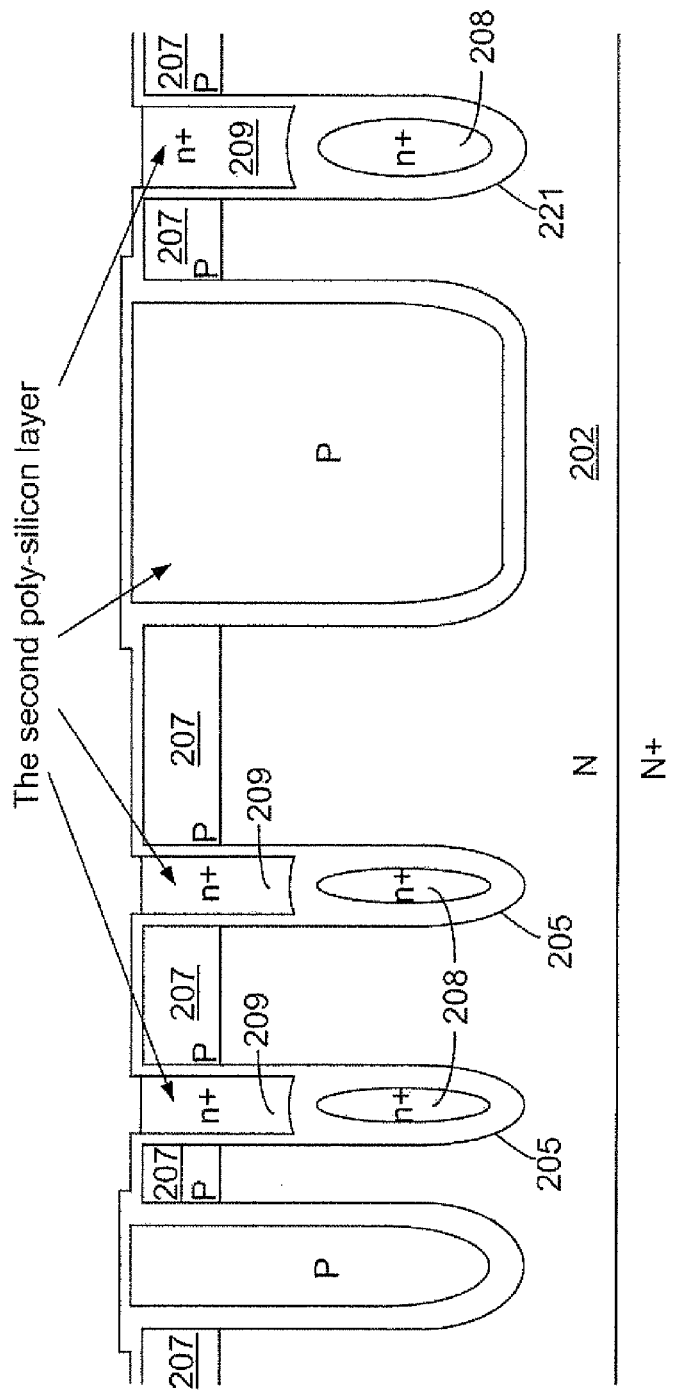
Figure 7F:
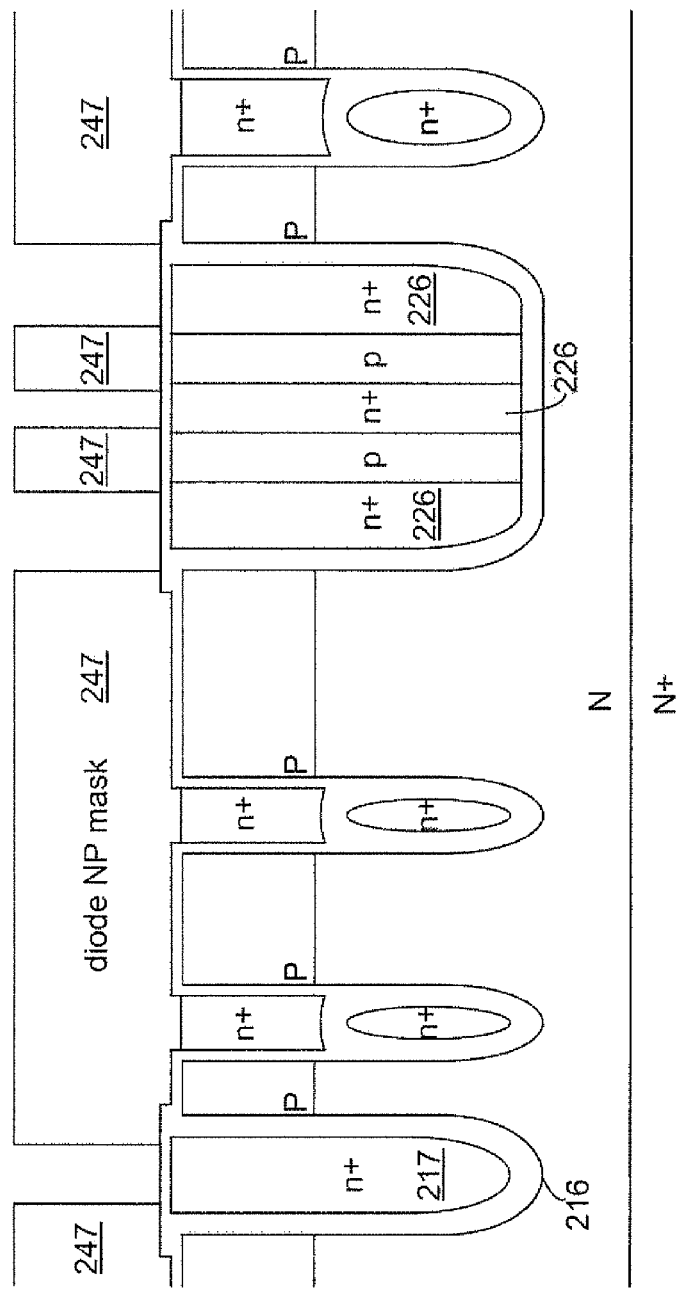

In FIG. 7E, a second poly-silicon layer comprising an n+ doped poly-silicon layer is deposited and then etched back or followed by a poly-silicon CMP process to leave the second poly-silicon layer within the upper portion of each the first type gate trench 205 and the third type gate trench 221 to form a gate electrode 209 insulated from the shielded electrode 208. Then, a Boron ion implantation is carried out to form P body regions 207 in an upper portion of the N epitaxial layer 202 between every two adjacent gate trenches without a P body mask. In FIG. 7F, after applying a diode NP mask 247, a source dopant ion implantation followed by P body and source dopant diffusion process is carried out to form the n+ doped regions 226 in the trenched clamp diode, while to make the first poly-silicon layer an n+ type to form a single shielded electrode 217 in the second type gate trench 216.

Figure 7G:
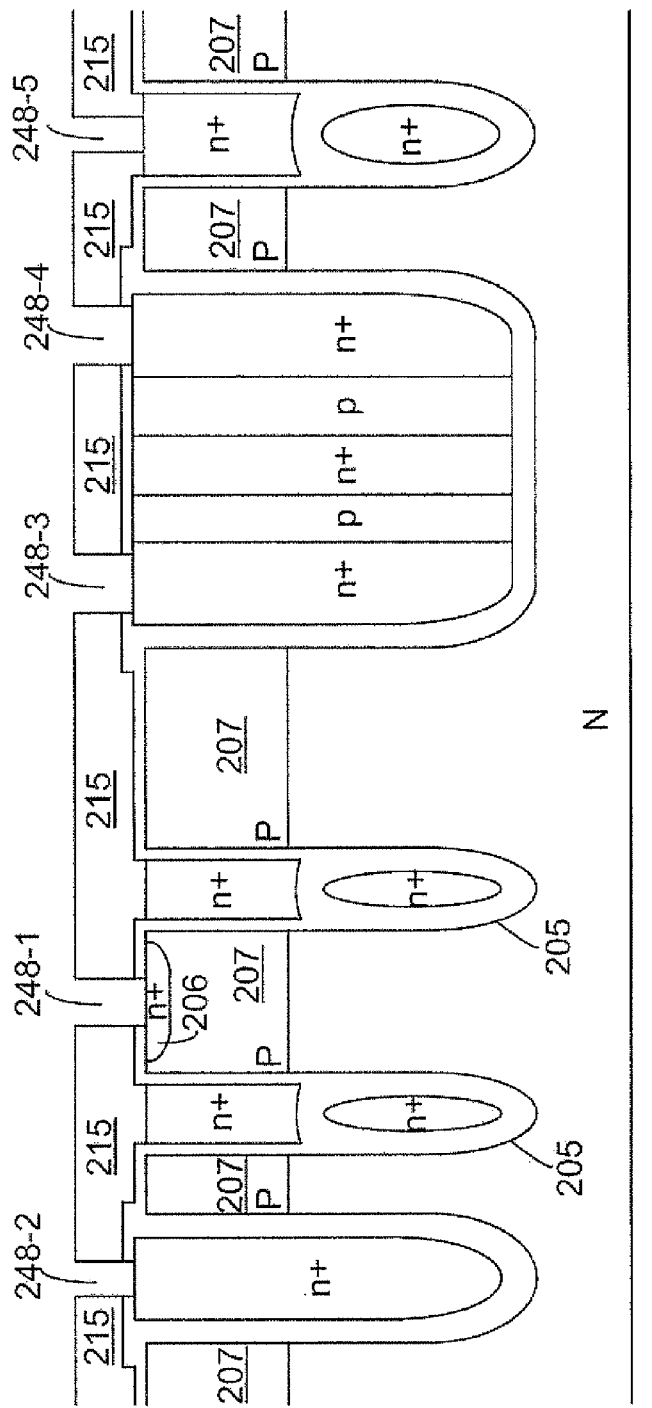

In FIG. 7G, a contact interlayer 215, for example an oxide layer, is deposited on an entire surface of the structure of FIG. 7F. Then, a contact mask (not shown) is employed and then followed by a dry oxide etching process to open a plurality of contact holes (248-1~248-5) penetrating through the contact interlayer 215 to expose the poly-silicon layer and the P body regions 207 underneath. Next, another source dopant ion implantation is carried out to form n+ source regions 206 near a top surface of the P body regions 207 between a pair of the first type gate trenches 205 without a source mask.

Figure 7H:
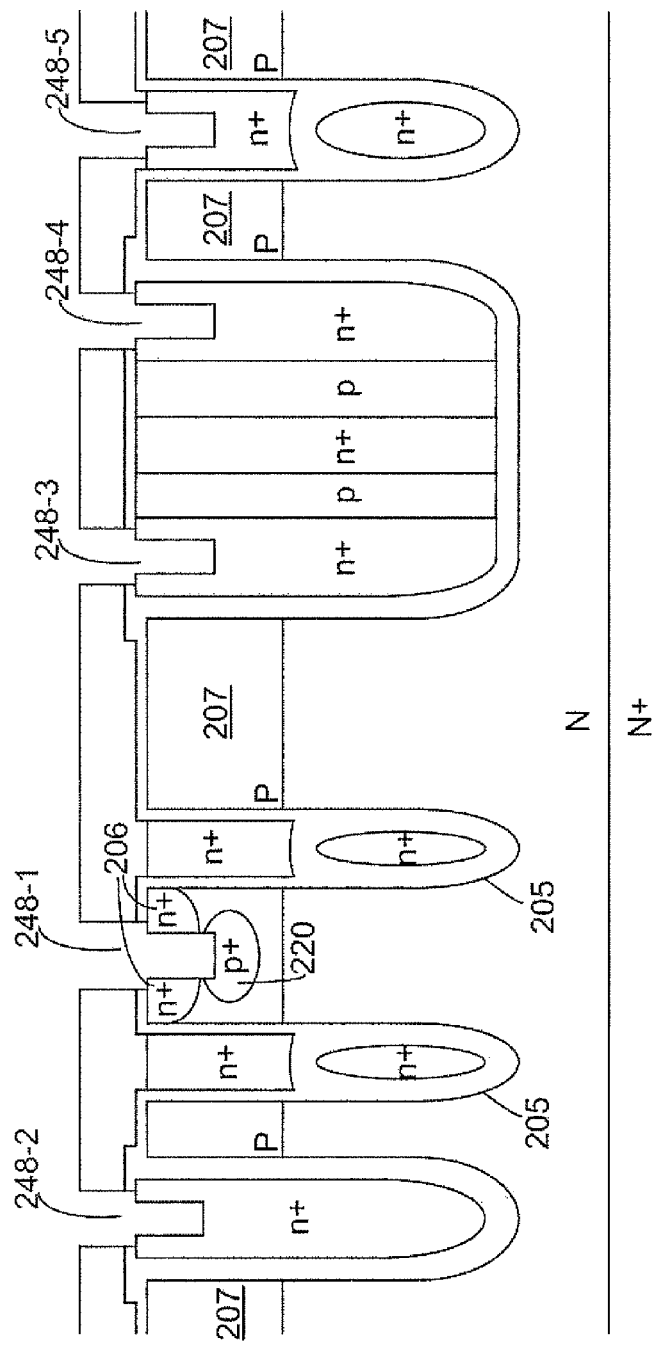

In FIG. 7H, a source dopant diffusion step is first carried out to diffuse the source dopant from center portion between the pair of the first type gate trenches 205 to adjacent channel regions near the first type gate trenches 205. Then, a dry silicon etching process is performed to make the contact holes (248-1~248-5) further extend downward into the poly-silicon layer and the P body regions 207 underneath. Next, after carrying out a BF2 ion implantation and a step of RTA (Rapid Thermal Annealing) process, a p+ body contact region 220 is formed underneath the n+ source region 206 and surrounding a bottom of the contact hole 248-1 within the P body region 207.

Figure 7I:
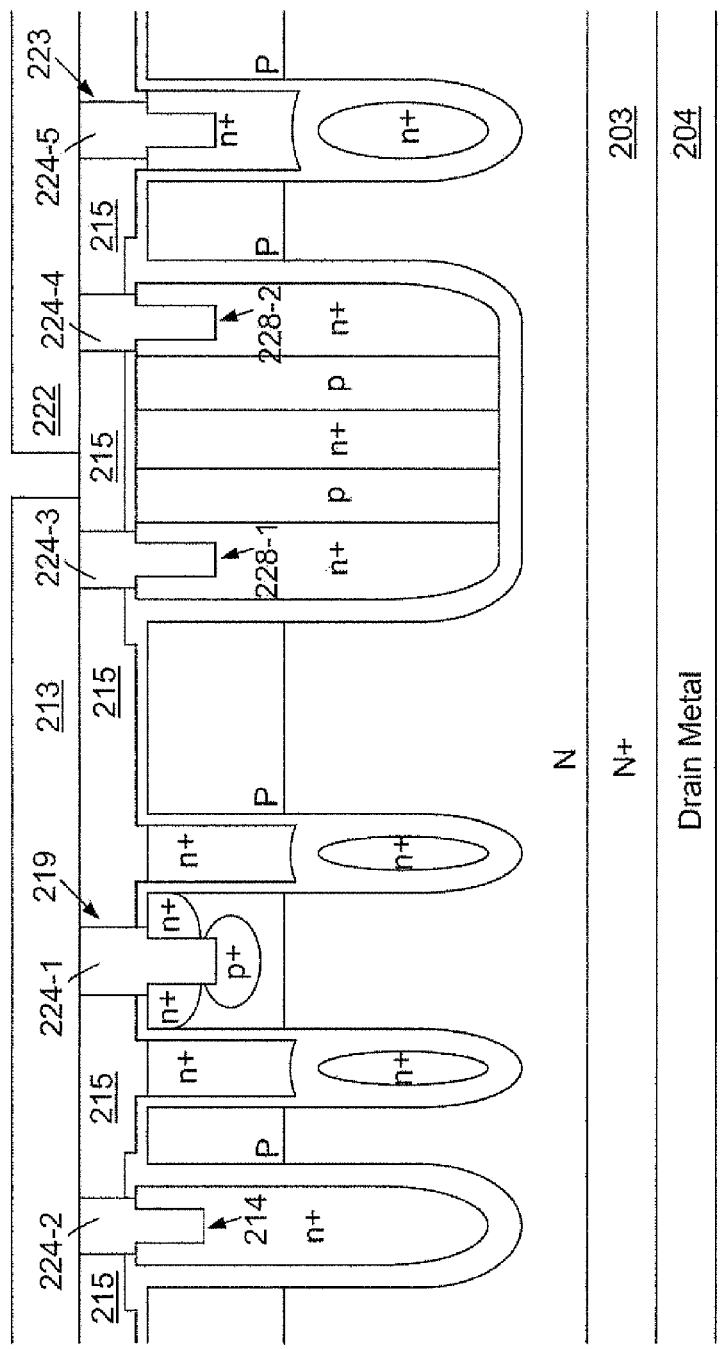

In FIG. 7I, a barrier layer Ti/TiN or Co/TiN or Ta/TiN is deposited on trench sidewalls and bottoms of all the contact holes (as shown in FIG. 7H). Then, a tungsten material layer is deposited onto the barrier layer, wherein the tungsten material layer and the barrier layer are then etched back to form contact metal plugs (224-1~224-5) respectively for: a trenched source-body contact 219, a trenched shielded electrode contact 214; trenched diode contacts 228-1 and 228-2; and a trenched gate contact 223. Then, a metal layer of Al alloys or Cu padded by a resistance-reduction layer Ti or Ti/TiN underneath is deposited onto the contact interlayer 215 and followed by a metal etching process by employing a metal mask (not shown) to form a source metal 213 and a gate metal 222. Last, a back metal layer of Ti/Ag/Ni is deposited onto a rear side of the N+ substrate 203 as a drain metal 204 after grinding.

Therefore, five masks are used in the whole manufacturing process: the trench mask; the shielded gate mask 246; the diode NP mask 247; the contact mask; and the metal mask.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A semiconductor power device integrated with a trenched clamp diode comprising:
    a plurality of first type gate trenches extending into a semiconductor silicon layer, surrounded by source regions of a first conductivity type encompassed in body regions of a second conductivity type in an active area;
    a trenched clamp diode comprising multiple back to back poly-silicon Zener diodes with alternating doped regions of said first conductivity type next to doped regions of said second conductivity type, formed in a wide first gate trench as a clamp diode trench extending into said semiconductor silicon layer;
    each of said first type gate trenches being filled with a shielded electrode in a lower portion and a gate electrode in an upper portion of said first type gate trenches wherein said source regions surrounding around said gate electrode, and said body regions disposed at a level above a bottom of said gate electrode;
    said shielded electrode formed by a first poly-silicon being insulated from said semiconductor silicon layer by a first gate insulation layer and said gate electrode formed by a second poly-silicon being insulated from said semiconductor silicon layer by a second gate insulation layer;
    said shielded electrode being insulated from said gate electrode by an inter-electrode insulation layer;
    said trenched clamp diode being formed by said first poly-silicon layer and being insulated from said semiconductor silicon layer by said first insulation layer; and
    a plurality of trenched source-body contacts penetrating through a contact interlayer, said source regions and extending into said body regions between adjacent said first type gate trenches filled with a contact metal plug and connected to a source metal layer of said semiconductor power device.

2. The semiconductor power device of claim 1, wherein:
    said source regions have a doping concentration along trench sidewalls of said trenched source-body contact higher than along an adjacent channel region near said first type gate trenches at a same distance from a top surface of said semiconductor silicon layer, said source regions have a junction depth along the trench sidewalls of said trenched source-body contact greater than along said adjacent channel region, and said source regions have a doping profile of a Gaussian-distribution along the top surface of said semiconductor silicon layer from the trench sidewalls of said trenched source-body contact to said adjacent channel region.

3. The semiconductor power device of claim 1, wherein:
    said source regions have a same doping concentration at a same distance from a top surface of said semiconductor silicon layer, and said source regions have a same junction depth from the top surface of said semiconductor silicon layer.

4. The semiconductor power device of claim 1 further comprises:
    a body contact doped region of said second conductivity type formed in said body regions and having a higher doping concentration than said body regions, wherein said body contact doped region is underneath said source regions and surrounding at least a bottom of said trenched source-body contact to reduce the contact resistance between said body regions and said contact metal plug in said trenched source-body contact.

5. The semiconductor power device of claim 1, wherein said contact metal plug is tungsten metal plug padded by a barrier metal layer, and has a top surface no higher than said contact interlayer.

6. The semiconductor power device of claim 1, wherein said contact metal plug is tungsten metal plug padded by a barrier layer, and is extending over said contact interlayer.

7. The semiconductor power device of claim 1 further comprises:
    a second type gate trench extending into said semiconductor silicon layer filled with a single shielded electrode formed by a first poly-silicon layer and insulated from said semiconductor silicon layer by said first gate insulation layer, wherein said single shielded electrode is connected to a source metal layer via a trenched shielded electrode contacts in said shielded electrode, filled with a contact metal plug;
    a third type gate trenches extending into said semiconductor silicon layer, filled with a shielded electrode and a gate electrode above, wherein said gate electrode in said fourth type gate trench is connected to a gate metal layer of said semiconductor power device via trenched gate contacts in said gate electrode, filled with a contact metal plug; and
    trenched clamp diode contacts filled with said contact metal plug and extending into said doped regions of said first conductivity type on two opposite sides of said trenched clamp diode.

8. The semiconductor power device of claim 6 further comprises a termination area comprises multiple trenched floating gates in fourth type gate trenches formed in said semiconductor silicon layer and spaced from each other, wherein each of said fourth type gate trenches is filled with a single electrode formed by a first poly-silicon layer, and insulated from said semiconductor silicon layer by a first gate insulation layer.

9. The semiconductor power device of claim 6 further comprises a termination area comprises multiple trenched floating gates in fourth type gate trenches formed in said semiconductor silicon layer and spaced from each other, wherein each of said fourth type gate trenches is filled with a shielded electrode and a gate electrode above padded by said first and said second insulation layer, respectively.

10. The semiconductor power device of claim 1 further comprises a trenched resistor formed by a doped poly-silicon extends into said semiconductor silicon layer.

11. The semiconductor power device of claim 9, wherein said doped poly-silicon layer has said first conductivity type.

12. The semiconductor power device of claim 9, wherein said doped poly-silicon layer has said second conductivity type.

13. The semiconductor power device of claim 1, wherein said semiconductor silicon layer comprises an epitaxial layer of said first conductivity type extending over a substrate of said first conductivity type.

14. The semiconductor power device of claim 1, wherein said semiconductor silicon layer comprises an epitaxial layer of said first conductivity type onto a buffer layer of said first conductivity type which is extending over a substrate of said second conductivity type.

* * * * *